(12) United States Patent
Foong et al.

(10) Patent No.: US 7,799,612 B2
(45) Date of Patent: Sep. 21, 2010

(54) PROCESS APPLYING DIE ATTACH FILM TO SINGULATED DIE

(75) Inventors: Sally Foong, Milpitas, CA (US); Tan Kiah Ling, Penang (MY); Kee Cheng Sim, Penang (MY); Wong Kwet Nam, Penang (MY); Yue Ho Foong, Penang (MY)

(73) Assignee: Spansion LLC, Sunnyvale, CA (US)

( * ) Notice: Subject to any disclaimer, the term of this patent is extended or adjusted under 35 U.S.C. 154(b) by 581 days.

(21) Appl. No.: 11/767,623

(22) Filed: Jun. 25, 2007

(65) Prior Publication Data

US 2008/0318364 A1 Dec. 25, 2008

(51) Int. Cl.
*H01L 21/00* (2006.01)

(52) U.S. Cl. ............ 438/118; 438/33; 438/68; 438/113; 438/114; 438/115; 438/116; 438/117; 438/458; 438/460; 438/461; 257/E23.026; 257/E21.508; 257/E21.511; 257/E23.081

(58) Field of Classification Search ............ 438/33, 438/68, 113–118, 458, 460, 461, 65; 257/779–786, 257/676, E23.026, E21.508, E21.511, E23.081
See application file for complete search history.

(56) References Cited

U.S. PATENT DOCUMENTS

| | | | | |
|---|---|---|---|---|
| 4,481,230 A * | 11/1984 | Hanak | ............ | 438/485 |
| 4,612,083 A * | 9/1986 | Yasumoto et al. | ............ | 438/59 |
| 5,118,567 A * | 6/1992 | Komiyama et al. | ............ | 428/345 |
| 5,357,399 A * | 10/1994 | Salisbury | ............ | 361/529 |
| 5,611,140 A * | 3/1997 | Kulesza et al. | ............ | 29/832 |
| 6,110,760 A * | 8/2000 | Medlen et al. | ............ | 438/107 |
| 6,271,597 B1 * | 8/2001 | Medlen et al. | ............ | 257/774 |
| 7,323,395 B2 * | 1/2008 | Huntington | ............ | 438/455 |
| 7,449,358 B2 * | 11/2008 | Patel et al. | ............ | 438/58 |
| 2004/0145028 A1 * | 7/2004 | Matsumoto et al. | ............ | 257/620 |
| 2004/0192029 A1 * | 9/2004 | Hartwell | ............ | 438/637 |
| 2005/0001304 A1 * | 1/2005 | Yoon et al. | ............ | 257/686 |
| 2005/0009237 A1 * | 1/2005 | Yamaguchi | ............ | 438/114 |
| 2005/0170614 A1 * | 8/2005 | Patel et al. | ............ | 438/460 |
| 2006/0121718 A1 * | 6/2006 | Machida et al. | ............ | 438/612 |
| 2006/0292823 A1 * | 12/2006 | Ramanathan et al. | ............ | 438/455 |

* cited by examiner

*Primary Examiner*—Fernando L Toledo
*Assistant Examiner*—Ankush K Singal
(74) *Attorney, Agent, or Firm*—Turocy & Watson, LLP

(57) ABSTRACT

Methods and systems of applying a plurality of pieces of die attach film to a plurality of singulated dice are provided. The method can involve making intervals between rows and columns of a plurality of pieces of die attach film. The interval can be made by expanding an underlaid expandable film on which the plurality of pieces of die attach film are placed or by removing portions of the die attach film between rows and columns of the plurality of pieces of die attach film. The method can further involve placing a plurality of singulated dice back side down on the plurality of pieces of die attach film.

16 Claims, 9 Drawing Sheets

PROCESS APPLYING DIE ATTACH FILM TO SINGULATED DIE

TECHNICAL FIELD

The subject invention generally relates to methods and systems of applying a plurality of pieces of die attach film to a plurality of singulated dice.

BACKGROUND

In the electronics industry, there is a need for apparatus of smaller size, higher performance, and higher memory storage. To achieve these high densities there have been, and continue to be, efforts toward scaling down device dimensions and increasing the number of layers of such devices on a chip. In order to accomplish such high device packing densities, smaller and smaller features sizes are required. This may include the thickness of the wafer, the width and spacing of interconnecting lines, spacing and diameter of contact holes, the surface geometry of various features, and the like.

The process of manufacturing semiconductors or integrated circuits (commonly called ICs or chips) typically consists of more than a hundred steps, during which hundreds of copies of an integrated circuit may be formed on a single wafer. Integrated circuit devices are typically fabricated on the thin wafers of silicon. Typically, after fabrication of the integrated circuit devices on the front surface of the wafer, the wafer is thinned to reduce the cross section of the wafer using a mechanical and/or chemical grinding process or etching.

After thinning the wafer, the wafer is generally sawn or diced into rectangularly shaped "dice" along two mutually perpendicular sets of parallel lines or streets separating each row and column of dice in the wafer. Thus, the individual integrated circuit semiconductor die in the form of semiconductor dice are singulated from the wafer. The die having functional devices may be packaged and further tested to ensure that each packaged device satisfies a minimum level of performance. Typically, the functional devices are attached to a substrate and packaged by encapsulating the die in a plastic package. Packaging of the functional devices facilitates handling of the devices and also protects the singulated die from damage during the manufacture of modules using the packaged devices.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

One aspect of the subject invention provides methods of applying a plurality of pieces of die attach film to a plurality of singulated dice. The methods involve making intervals between rows and columns of a plurality of pieces of die attach film by expanding an underlaid expandable film on which the plurality of pieces of die attach film are placed or by removing portions of the die attach film between rows and columns of the plurality of pieces of die attach film; and placing a plurality of singulated dice back side down on the plurality of pieces of die attach film.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

Figure 1:
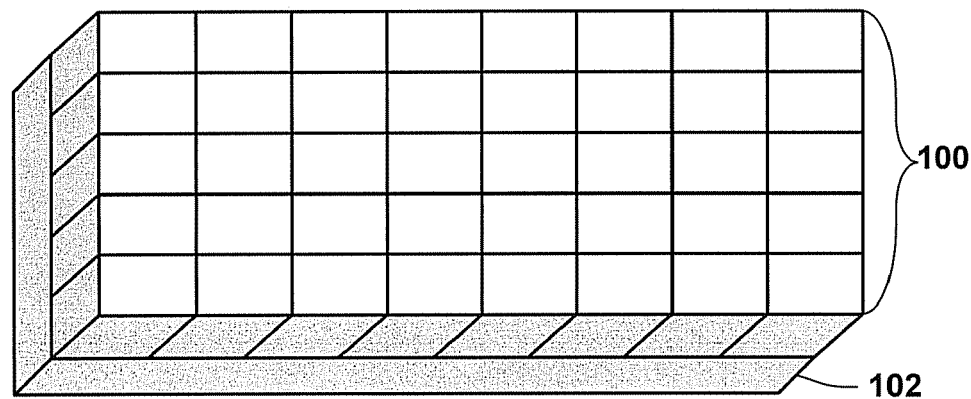
FIG. 1 illustrates a perspective view of a plurality of singulated dice back side down on a film in accordance with an aspect of the subject invention.

A die attach film is generally used for attaching a die to a substrate. A die attach film is typically laminated on a back side surface of a wafer in a wafer form. However, when handling a wafer in a wafer form for attaching the die attach film to the back side surface of the wafer, problems such as wafer breakage and wafer warpage easily occur. Moreover, when a die attach film is applied to a whole wafer, every die of the whole wafer has a limited shelf life of the die attach film.

Alternatively, a die attach film ribbon/roll is cut into small pieces, each piece having approximately the same size as a singulated die, and the pieces of the die attach film are pasted to the back side surfaces of the singulated dice or to the surface of substrates for stacking the singulated die on the substrate. However, cutting the thin die attach film ribbon/roll into the small individual pieces and pasting the individual pieces on the singulated dice or the substrate are laborious and time consuming.

The subject invention provides efficient methods and systems for applying a plurality of pieces of die attach film to a plurality singulated dice. The methods and systems can involve disposing a plurality of pieces of die attach film at suitable intervals and placing a plurality of singulated dice back side down on the plurality of pieces of die attach film. The plurality of pieces of die attach film can be laminated on the plurality of singulated dice at one time.

The methods and systems by applying the plurality of pieces of die attach film to the plurality of singulated dice can provide one or more of the following advantages: 1) wafer breakage and/or wafer warpage can be prevented, 2) a limited shelf life of pre-applied die attach film at a wafer level can be eliminated since a die attach film application is moved to a singulated die level, and 3) the productivity of attaching pieces of die attach film to singulated dice of the subject invention can be significantly high compared to a productivity of a method of cutting a die attach film ribbon/roll into small pieces and pasting the pieces to the back side surfaces of the singulated dice individually.

The term "plurality" in this context may refer to the number of singulated dice that can be obtained from a single wafer by dicing the wafer. The numbers and sizes of singulated dice may vary depending upon, for example, the size of the wafer and/or the type of devices being fabricated. The exact numbers of the singulated dice typically are in the tens or hundreds. In one embodiment, the term "plurality" is referred to as about 20 or more and about 1,000 or less. In another embodiment, the term "plurality" is referred to as about 30 or more and about 900 or less. In yet another embodiment, the term "plurality" is referred to as about 40 or more and about 700 or less.

The singulated dice and/or pieces of die attach film can be placed in rows and columns, and then the plurality of pieces of die attach film can be applied on the plurality of singulated dice. The singulated dice and/or pieces of die attach film can be placed in any suitable number of rows and columns. In one embodiment, the placed singulated dice and/or pieces of die attach film have about 2 of rows and columns or more and about 50 rows and columns or less of. In another embodiment, the placed singulated dice and/or pieces of die attach film have about 4 of rows and columns or more and about 30 of rows and columns or less. In yet another embodiment, the placed singulated dice and/or pieces of die attach film have about 6 of rows and columns or more and about 25 of rows and columns or less.

The subject invention is now described with reference to the drawings, wherein like reference numerals are used to refer to like elements throughout. In the following description, for purposes of explanation, numerous specific details are set forth in order to provide a thorough understanding of the subject invention. It may be evident, however, that the invention can be practiced without these specific details. In other instances, well-known structures and devices are shown in block diagram form in order to facilitate describing the invention. Referring to FIGS. 1 to 9, FIGS. 10 to 13, and FIGS. 14 to 17, three of many possible exemplary embodiments of applying a plurality of pieces of die attach film to a plurality of singulated dice are illustrated.

FIG. 1 illustrates a perspective view of a plurality of singulated dice 100 back side down on a tape or film 102 (hereinafter referred to collectively as "film"). The singulated dice 100 can be individually picked and placed back side down on the film 102 by, for example, pick-and-place tools.

The singulated dice 100 (e.g., individual integrated circuit semiconductor dice) can be formed by any suitable technique. For example, singulated dice 100 are formed in the following process. A singulated die 100 is usually formed from a larger structure known as a semiconductor wafer. Wafers are usually formed by slicing a large cylindrically shaped crystal of silicon, although other materials such as gallium arsenide and indium phosphide can be also used. The front side surface of the wafer is typically first ground and polished to a smooth surface for fabrication of multiple integrated circuits thereon. Each semiconductor wafer has a plurality of integrated circuits arranged in rows and columns with the periphery of each integrated circuit typically being substantially rectangular.

Fabrication of the integrated circuits is performed on the front side surface of the undivided wafer, and consists of various processes including layering, patterning, doping, etching and heat treatment, for example. Various layers applied to the front side surface of the wafer typically include insulators, semiconductors and metallic conductors. As a result, the front side surface of the wafer can include circuit elements or devices, such as lines, vias, terminals, transistors, data storage elements, image sensors, or other conductor or semiconductor components arranged in an array. The final layering act generally involves applying a passivation material on the front side surface to cover the integrated circuit with a smooth electrically insulative protective layer.

The individual active portions on the front side surface of the wafer can be separated from each other by a plurality of non-active portions. These non-active portions are commonly aligned with one another to facilitate cutting with, for example, a wafer saw in a subsequent process, defining so-called streets or scribe lines between the individual dice.

Further protection from damage during thinning of the wafer back side surface may be provided by temporarily attaching a backgrind film (e.g., an adhesive-backed polymer sheet such as vinyl sheet) to the back side surface of the wafer. The wafer thinning typically includes mechanical grinding and chemical-mechanical polishing. If necessary, stresses induced by the layering process and/or wafer thinning process can be optionally relieved to prevent wafer and semiconductor die warping or bowing.

After thinning the wafer, the backgrind film may be removed and the wafer is cut to separate the individual die for further processing. Prior to cutting, an adhesive film (e.g., dicing film) may be attached to the back side surface of the wafer to hold the die in place following the cutting operation. The wafer can be cut along streets or scribe lines with a rotating circular abrasive saw blade. The wafer can be diced by any suitable technique such as wafer sawing, laser cutting, and the like, thereby forming a plurality of singulated dice 100. The plurality of dice 100 is usually rectangular in shape.

In another embodiment, a plurality of singulated dice 100 is formed by a dicing before grinding (DBG) technique. In the DBG process, a front side surface of a wafer is scored (e.g., grooved) to a predetermined depth. The front side surface of the wafer is protectively filmed to shield the front side surface during grinding. The semiconductor wafer is then subjected to a back grinding process until the scores or grooves are reached by the grinder, at which point a plurality of semiconductor dice 100 automatically separate.

Optionally, the singulated dice 100 may be subjected to various tests to determine the reliability of the dice before packaging the dice. For example, the singulated dice 100 are subjected to a known-good-die test. After the known-good-die test, the only known-good-dice can be processed in subsequent processes.

The singulated dice 100 are removed from the cut wafer and placed on the film 102. When the known-good-die test is performed, the locations of the good dice may be identified from a wafer map and a pick-and-place tool is used to pick the known-good-dice from the wafer and place the dice onto the film 102.

The film 102 can be any suitable adhesive film 102 that can adhere to the back side surfaces of the singulated dice 100. For example, commercially available dicing film 102 can be employed as the film 102. In another embodiment, the film 102 is an adhesive film including polytetrafluoroethylene films; polyethylene terephthalate films; polyolefin films such as polyethylene films, polypropylene films, and polymethylpentene films; polyimide films; and the like. The adhesive film 102 may be subjected to a surface treatment for having suitable adhesiveness including primer painting, ultraviolet (UV) treatment, corona discharge treatment, polishing treatment, etching treatment, and the like. In yet another embodiment, the film 102 contains a base film and an adhesive on the base film. The film 102 can contain any suitable base film and adhesive. Examples of base films include cellulose acetate films (e.g., cellulose triacetate (TAC) films and cellulose diacetate films), polyolefin films, polyvinylchloride films, polyester films, polyethylene terephthalate films, polyethylene naphthalate films, polyamide films, polyimide films, acrylic films, polyarylate films, polyether sulfone films, cyclic polyolefin films, and the like. Examples of adhesives on the base film include UV-sensitive adhesives, pressure sensitive adhesives such as UV-curable pressure sensitive adhesives, and the like. Specific examples of adhesives include epoxies, cyanate esters, polyimides, siloxane polyimides, maleimides, silicones, combinations of thereof, and the like. The adhesive can be formed on the base film by, for example, painting and drying the adhesive composition.

Figure 2:
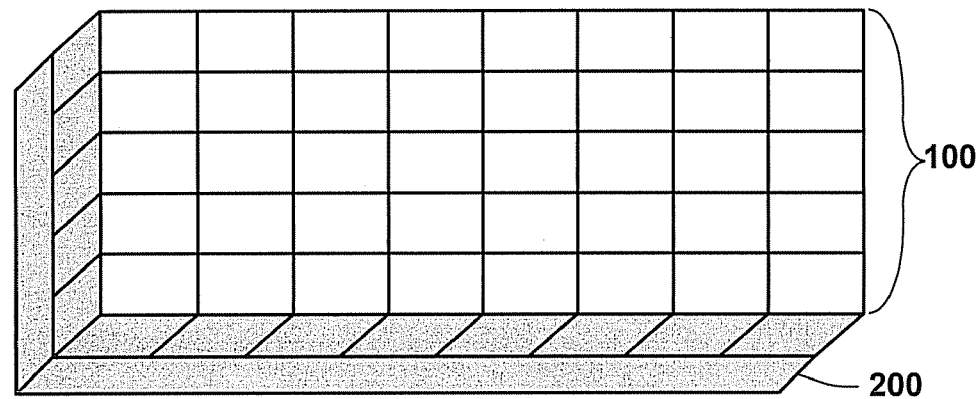
FIG. 2 illustrates a perspective view of a plurality of singulated dice remounted front side down on a first expandable film in accordance with an aspect of the subject invention.

FIG. 2 illustrates a perspective view of a plurality of singulated dice 100 remounted front side down on a first expandable film 200. The singulated dice 100 can be remounted front side down on the first expandable film 200 by placing the film 102 having the singulated dice 100 as described in connection with FIG. 1 on the first expandable film 200 so that the film 102 and first expandable film 200 sandwich the singulated dice 100 and removing the film 102 from the back side surfaces of the singulated dice 100. The film 102 having the singulated dice 100 as described in connection with FIG. 1 can be placed on the first expandable film 200 by any suitable technique. For example, the film 102 having a plurality of singulated dice 100 is placed on the first expandable film 200 by a mounter. Examples of mounters include those under the trade designations LH830/LH 832, which is available from Longhill Industries Limited; the trade designations Kitten 100, which is available from ICAT; and the trade designations DFM2700, which is available from Disco Corporation.

The first expandable film 200 can be attached to the front side surfaces of the plurality of singulated dice 100 by pressure applied with any suitable tool. For example, the first expandable film 200 is attached to the front side surfaces of the plurality of singulated dice 100 by pressure applied with a semi-balloon structure. The semi-balloon structure may contain a soft membrane. The soft membrane can be filled with regulated compressed air so as to make the air pressure of the semi-balloon structure adjustable.

After attaching the first expandable film 200 to the front side surfaces of the plurality of the singulated dice 100, the film 102 can be removed from the back side surfaces of the plurality of the singulated dice 100 by any suitable technique. In one embodiment, the film 102 can be removed from the back side surfaces of the plurality of the singulated dice 100 by peeling off. In another embodiment, the film 102 can be removed from the back side surfaces of the plurality of the singulated dice 100 by reducing the adhesion between the film 102 and the back side surfaces of the plurality of the singulated dice 100 via, for example, exposing the film 102 to UV radiation and/or heating the film 102 to elevated temperatures.

The first expandable film 200 typically contains an expandable base film and adhesive on the base film. The first expandable film 200 can be expanded in a subsequent process to a desired level that provides sufficient intervals between the singulated dice 100. The first expandable film 200 can contain any suitable expandable base film and adhesive on the base film. Examples of expandable base films include polyolefin, polyvinylchloride, polyethylene terephthalate, and the like. Examples of adhesives on the expandable base include UV-sensitive adhesives, pressure sensitive adhesives such as UV-curable pressure sensitive adhesives, and the like. Specific examples of adhesives include epoxies, cyanate esters, polyimides, siloxane polyimides, maleimides, silicones, combinations of thereof, and the like. Commercially available expandable dicing films can be employed as the first expandable film 200.

The first expandable film 200 can have any suitable adhesive tack level. For example, the level of the adhesion of the first expandable film 200 is high enough to hold dice firmly during a certain process, but low enough for dice to be easily removed after finishing the process. When a low tack expandable film is employed as a first expandable film 200, the process can be simplified since the low tack expandable film can be easily removed by, for example, peeling off from the front side surfaces of the singulated dice 100 in subsequent processes.

Figure 3:
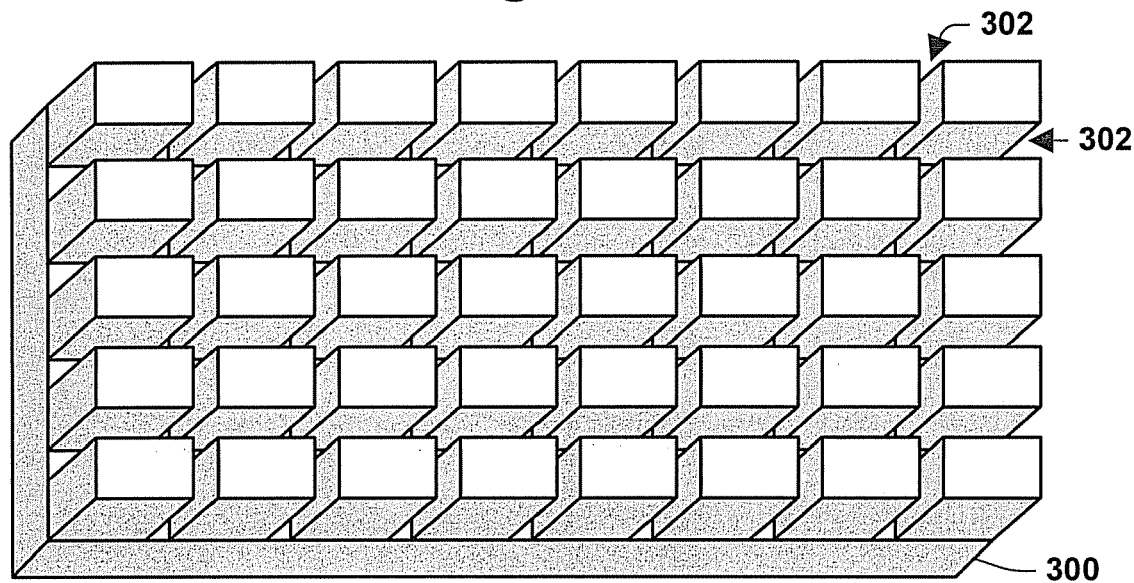
FIG. 3 illustrates a perspective view of a plurality of singulated dice mounted front side down on a first expanded film after expanding the first expandable film in accordance with an aspect of the subject invention.

FIG. 3 illustrates a perspective view of a plurality of singulated dice 100 mounted front side down on a first expanded film 300 after expanding the first expandable film 200. The plurality of singulated dice 100 mounted front side down on the first expanded film 300 has intervals 302 between rows and columns of the singulated dice 100.

The first expandable film 200 can be expanded by any suitable technique. For example, the first expandable film 200 is expanded by heating the first expandable film 200 to elevated temperatures such as a temperature of about 50 degrees Celsius or more and about 200 degrees Celsius or less. The intervals 302 (e.g., expanding amount) can be controlled by, for example, selecting suitable constituents and/or thickness of the first expandable film 200, adjusting the expanding conditions (e.g., temperature and time period), and the like. The first expandable film 200 can be expanded in every direction (e.g., 360 degrees). For example, first expandable film 200 is expanded at the same level in both the row and column directions.

The first expandable film 200 can be expanded to any suitable level. For example, the first expandable film 200 is expanded to a desired level so that the length of intervals 302 (e.g., a distance between the two singulated dice 100 that are next to each other) facilitates use of the singulated dice 100 in subsequent manufacturing processes (e.g., placing the singulated dice 100 on the pieces of die attach film). The intervals 302 between the rows and columns of singulated dice 100 may be set independently. In one embodiment, all of the intervals 302 between the rows and columns of singulated dice 100 have the same lengths. In another embodiment, all of the intervals 302 between the rows of singulated dice 100 have the same lengths, all of the intervals 302 between the columns of singulated dice 100 have the same lengths, but the intervals 302 between the rows are different from the intervals 302 between the columns.

The lengths of intervals 302 may vary and are not critical to the subject invention. The first expanded film 300 has any suitable interval length that depends on, for example, the desired implementations of the subject invention. In one embodiment, the interval lengths are about 0.1 millimeter or more and about 10 millimeters or less. In another embodiment, the interval lengths are about 0.5 millimeters or more and about 7 millimeters or less. In yet another embodiment, the interval lengths are about 1 millimeter or more and about 5 millimeters or less.

Figure 4:
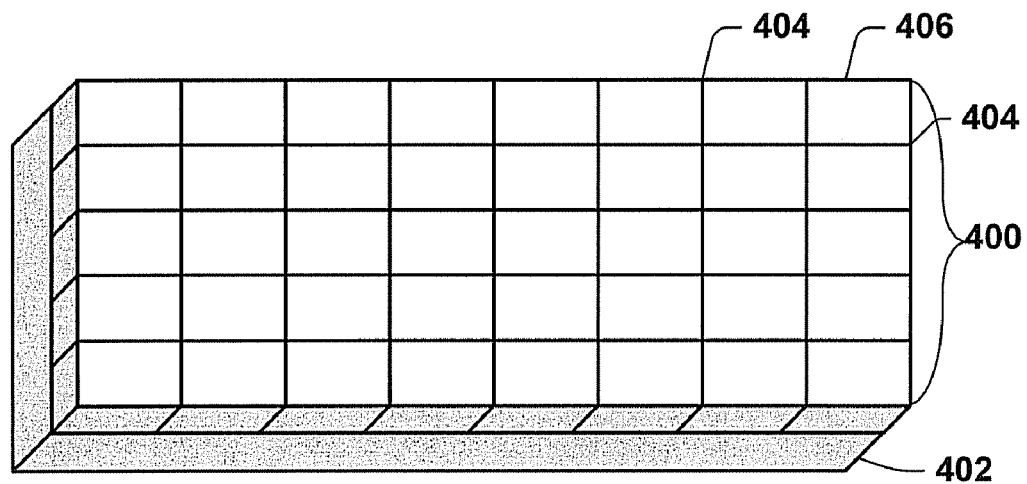
FIG. 4 illustrates a perspective view of a die attach film on a second expandable film in accordance with an aspect of the subject invention.

FIG. 4 illustrates a perspective view of a die attach film 400 on a second expandable film 402. The die attach film 400 can be any suitable adhesive film that can attach the back side surfaces of the singulated dice 100 to a substrate. For example, the die attach film 400 contains a polyimide adhesive, epoxy adhesive, acrylic adhesive, and the like. In another embodiment, commercially available wire embedding films can be employed as the die attach film.

The second expandable film 402 can be any suitable film that can be expanded under suitable conditions, for example, elevated temperatures. For example, the second expandable film 402 contains any of the materials of the first expandable films 200 described in connection with FIG. 2. Commercially available expandable dicing films can be employed as the second expandable film 402. In one embodiment, the second expandable film 402 is the same as the first expandable film 200.

A die attach film 400 has cuts 404 to separate the die attach film 400 into small pieces 406. In one embodiment, each piece 406 of die attach film 400 has the substantially same size as the back side surfaces of the singulated dice 100. The die attach film 400 can be cut by any suitable technique. In one embodiment, the die attach film 400 placed on a second expandable film 402 is diced by, for example, a scriber, blade, laser, and the like. In another embodiment, a die attach film 400 having cuts 404 placed on a second expandable film 402 is commercially available. Such a die attach film 400 may be referred to as a pre-cut dicing-die attach film, and is available under the trade designations FH900 series (e.g., FH-WP 108/FH-WP113), which is available from Hitachi Chemical Co., Ltd.

Figure 5:
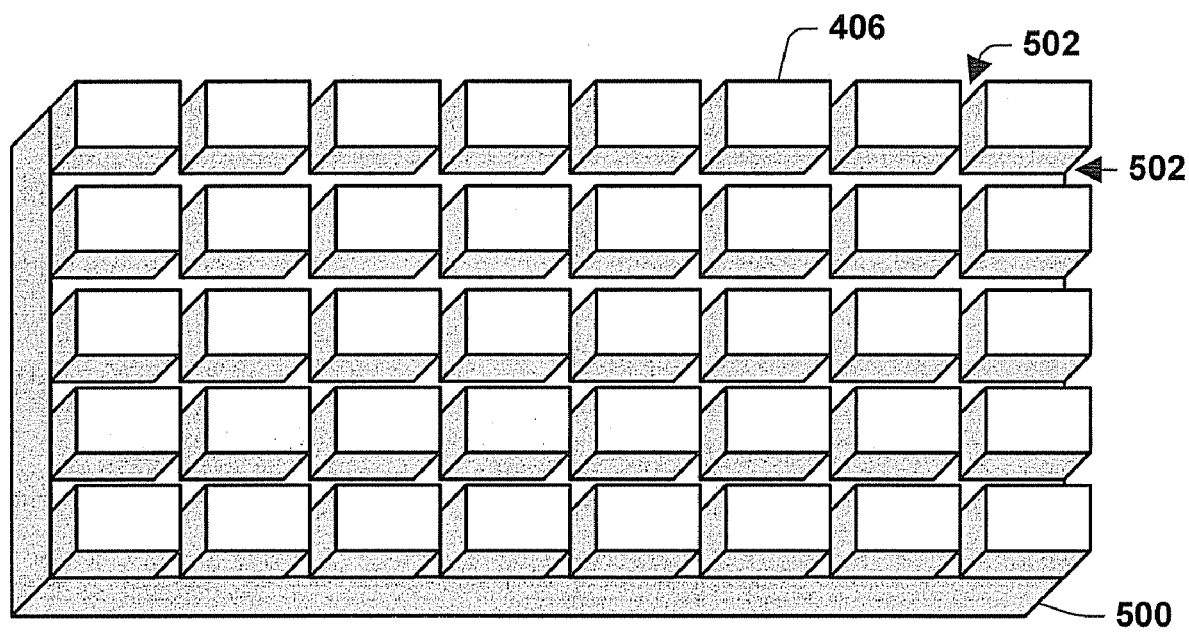
FIG. 5 illustrates a perspective view of a plurality of pieces of die attach film on a second expanded film after expanding the second expandable film in accordance with an aspect of the subject invention.

FIG. 5 illustrates a perspective view of a plurality of pieces 406 of die attach film 400 on a second expanded film 500 after expanding a second expandable film 402. The plurality of pieces 406 of die attach film on the second expanded film 500 have intervals 502 between rows and columns of the pieces 406 of die attach film 400. The second expandable film 402 can be expanded by any suitable technique. For example, the second expandable film 402 is expanded in the same manner described in connection with the expansion of the first expandable film 300 in FIG. 3.

The second expandable film 402 can be expanded to any suitable level. For example, the second expandable film 402 can be expanded to a desired level so that the length of intervals 502 (e.g., a distance between the two pieces 406 that are next to each other) facilitates use of the pieces 406 of die attach film 400 in subsequent manufacturing processes (e.g., placing the singulated dice 100 on the pieces 406 of die attach film 400). The intervals 502 between the rows and columns of pieces 406 of die attach film 400 may be set independently. In one embodiment, the second expandable film 402 is expanded to the substantially same level as the first expandable film 200 described in connection with FIG. 3. That is, the intervals 502 between the pieces 406 of die attach film 400 is the substantially same as the intervals 302 between the singulated dice 100. As a result, when placing the first expanded film 300 having the singulated dice 100 on the second expanded film 500 having the pieces 406 of die attach film 400 in a subsequent process, each singulated die 100 can be placed on each piece 406 of die attach film 400.

Figure 6:
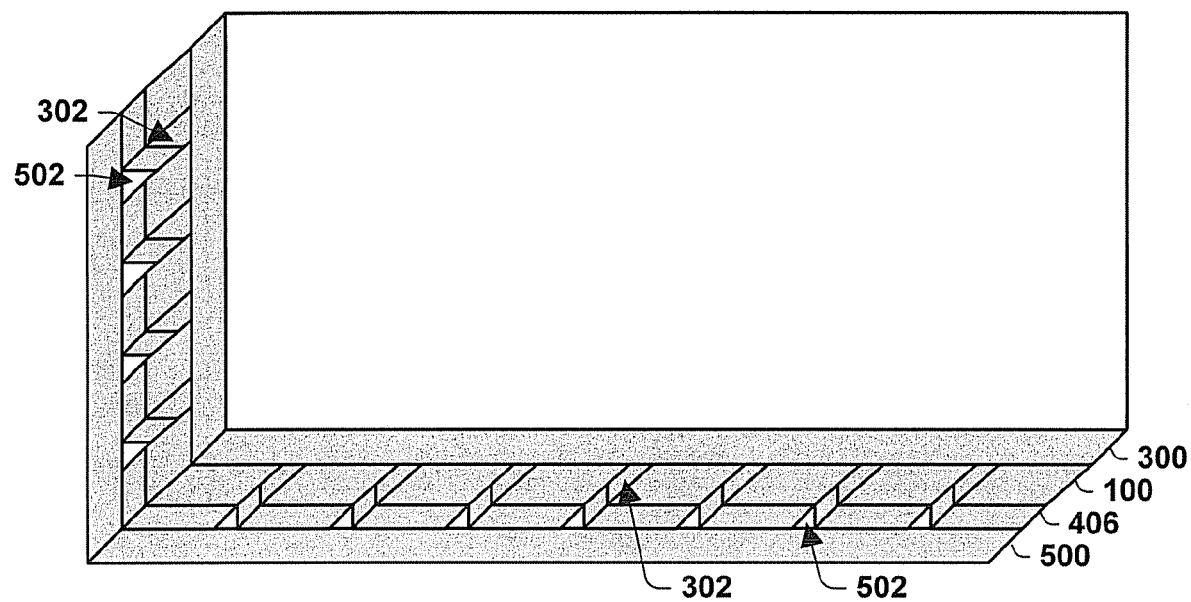
FIG. 6 illustrates a perspective view of a first expanded film having a plurality of singulated dice on a second expanded film having a plurality of pieces of die attach film in accordance with an aspect of the subject invention.
Figure 7:
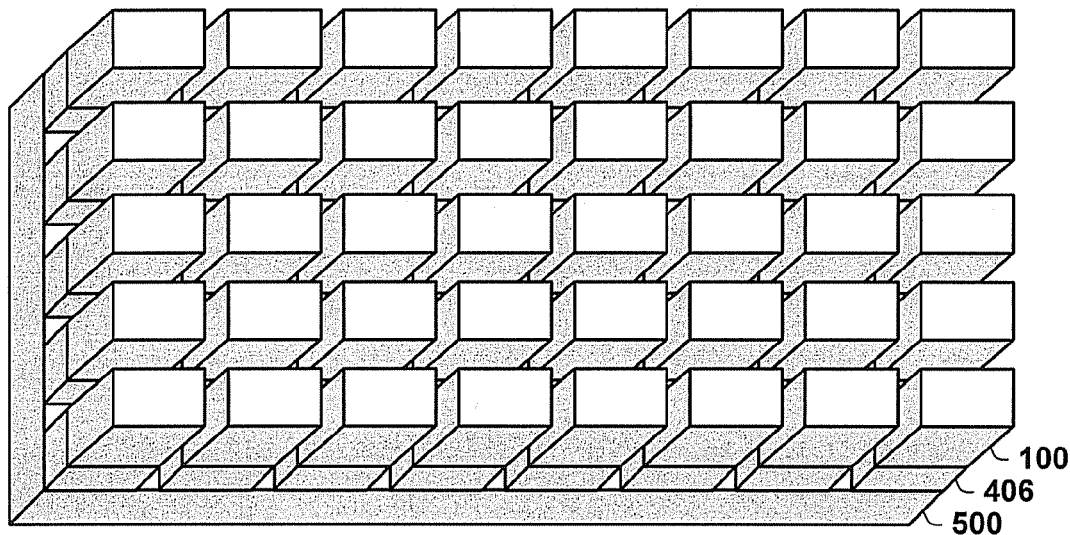
FIG. 7 illustrates a perspective view of a plurality of singulated dice attached back side down to a plurality of pieces of die attach film on a second expanded film in accordance with an aspect of the subject invention.

FIGS. 6 and 7 illustrate remounting a plurality of singulated dice 100 back side down on a second expanded film 500 by placing the first expanded film 300 having the plurality of singulated dice 100 on a second expanded film 500 having a plurality of pieces 406 of die attach film 400. Specifically, FIG. 6 illustrates a perspective view of a first expanded film 300 having a plurality of singulated dice 100 on a second expanded film 500 having a plurality of pieces 406 of die attach film 400.

The first expanded film 300 can be placed on the second expanded film 500 by any suitable technique. For example, the first expanded film 300 is placed on the second expanded film 500 by a mounter. Examples of mounters include those under the trade designations LH830/LH 832, which is available from Longhill Industries Limited; the trade designations Kitten 100, which is available from ICAT; and the trade designations DFM2700, which is available from Disco Corporation. The mounter may have orientation alignment features in, for example, x, y, and theta directions for aligning each singulated die 100 with each piece 406 of die attach film 400.

Each singulated die 100 can be aligned with each piece 406 of die attach film 400 by any suitable technique. In one embodiment, a mark on the singulated die 100 is placed in an appropriate position on the piece 406 of die attach film 400 to act as guides for alignment. In another embodiment, the edges of the singulated die 100 and/or pieces 406 of die attach film 400 serve as alignment guides. When the pieces 406 of die attach film 400 have the substantially same sizes as the back side surfaces of the singulated dice 100 and the intervals 502 between the pieces 406 of die attach film 400 have the substantially same lengths as the intervals 302 between the singulated dice 100, each singulated die 100 can be placed back side down substantially exactly on the each piece 406 of die attach film 400.

If necessary, to provide secure adhesion between the back side surfaces of the plurality of the singulated dice 100 and the plurality of pieces 406 of die attach film 400, the singulated dice 100 and the pieces 406 of die attach film 400 can be subjected to any suitable process. For example, pressure is applied on the singulated dice 100 to adhere the back side surfaces of the plurality of the singulated dice 100 to the pieces 406 of die attach film 400.

FIG. 7 illustrates a perspective view of a plurality of singulated dice 100 attached back side down to a plurality of pieces 406 of die attach film 400 on a second expanded film 500. The first expanded film 300 is removed from the front side surfaces of the plurality of singulated dice 100, and the plurality of the singulated dice 100 attached back side down to the pieces 406 of die attach film 400 on the second expanded film 500 is obtained. The first expanded film 300 can be removed from the front side surfaces of the plurality of singulated dice 100 by any suitable technique. In one embodiment, the first expanded film 300 is removed by peeling off. In another embodiment, the first expanded film 300 is removed by reducing the adhesion between the first expanded film 300 and the front side surfaces of the singulated dice 100 via exposing the first expanded film 300 to UV radiation and/or heating the film 300 to elevated temperatures.

Figure 8:
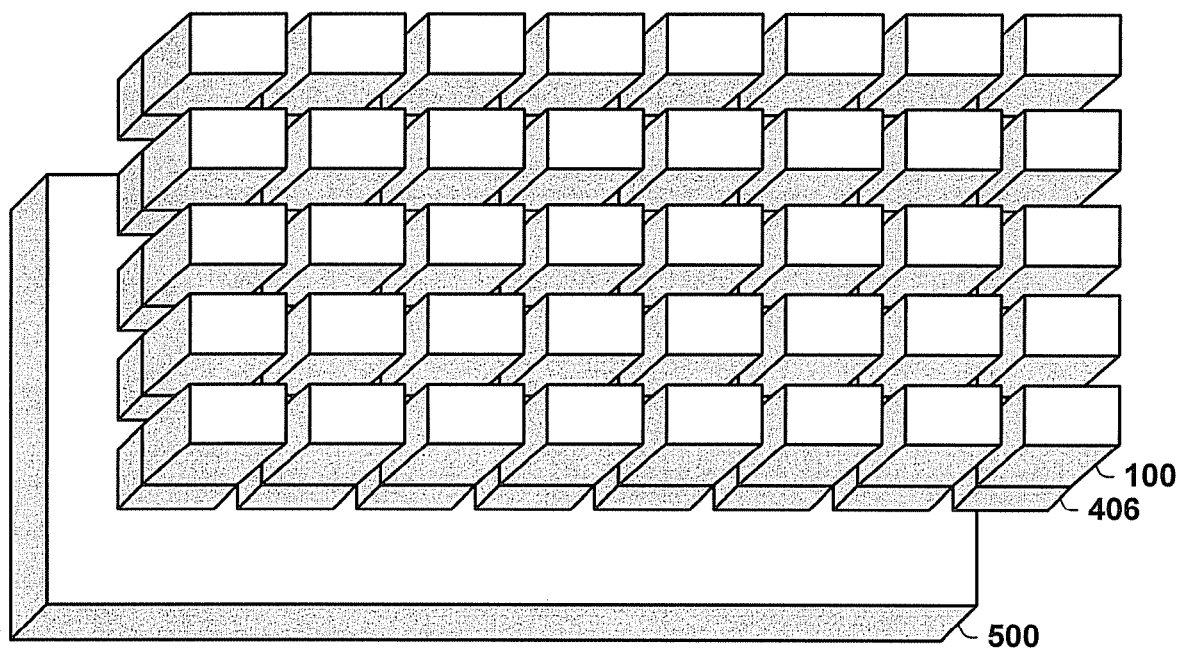
FIG. 8 illustrates a perspective view of a plurality of singulated dice on a plurality of pieces of die attach film detached from a second expanded film in accordance with an aspect of the subject invention.

FIG. 8 illustrates a perspective view of a plurality of singulated dice 100 on a plurality of pieces 406 of die attach film 400 detached from a second expanded film 500. The second expanded film 500 can be removed from the plurality of pieces 406 of die attach film 400, and the plurality of singulated dice 100 attached back side down to the pieces 406 of die attach film 400 is obtained. The second expanded film 500 can be removed from the plurality of pieces 406 of die attach film 400 by any suitable technique. In one embodiment, the second expanded film 500 is removed from the plurality of pieces 406 of die attach film 400 by reducing the adhesion between the second expanded film 500 and the plurality of the pieces 406 of die attach film 400 via, for example, exposing the second expanded film 500 to UV radiation and/or heating the film 500 to elevated temperatures.

Figure 9:
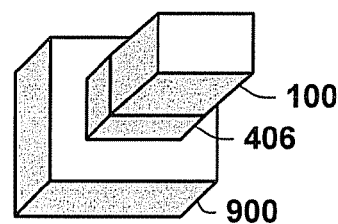
FIG. 9 illustrates a singulated die attached to a substrate by a die attach film in accordance with an aspect of the subject invention.

FIG. 9 illustrates attaching a singulated die 100 to a substrate 900 by a piece 406 of die attach film 400. If necessary, the singulated die 100 can be attached back side down to the substrate 900 by the piece 406 of die attach film 400 that is attached to the back side surface of the singulated die 100. The singulated die 100 can be attached on any suitable substrate. Examples of substrates include lead frames containing external electrical connections for an IC, computer boards, other mounting surfaces for, for example, bonding in an IC package or placing on a carrier for further packaging, and the like.

The singulated die 100 can be attached on the substrate 900 by any suitable technique. In one embodiment, the singulated die 100 is individually attached back side down on the substrate 900 by, for example, a pick-and-place tool and die attach tool (e.g., die bonders). If necessary, the piece 406 of die attach film 400 between the back side surface of the singulated die 100 and the substrate 900 may be cured to adhere the singulated die 100 to the substrate 900 by any suitable technique. For example, the piece 406 of die attach film 400 is cured by heating, exposing curing wavelengths of radiation, exposing to a catalyst, and the like.

Figure 10:
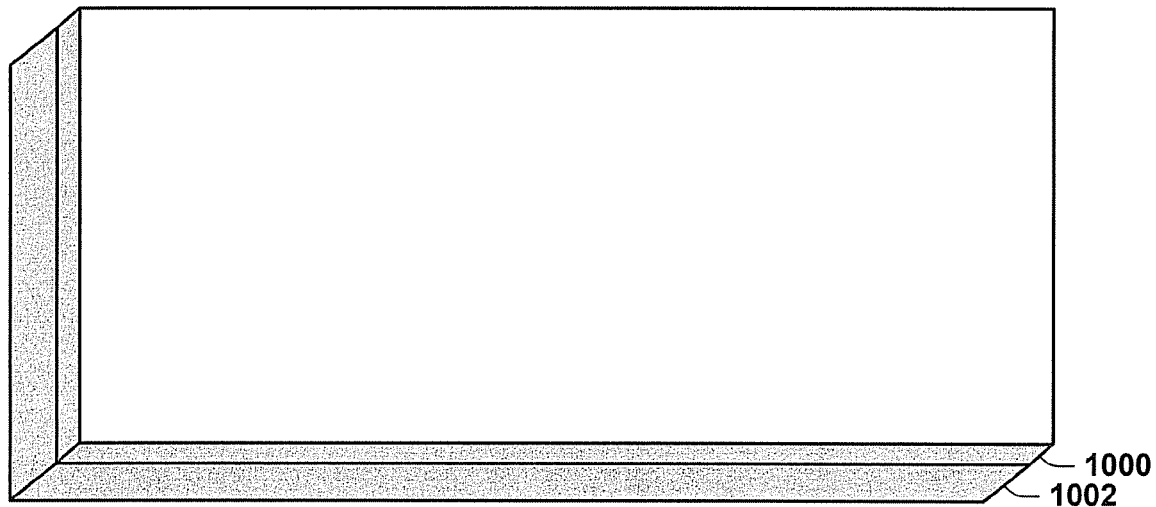
FIG. 10 illustrates a perspective view of a die attach film on a film in accordance with an aspect of the subject invention.

FIG. 10 illustrates a perspective view of a die attach film 1000 on a film 1002. The die attach film 1000 can be any suitable adhesive film that can attach the back side surfaces of singulated dice to a substrate. For example, the die attach film 1000 contains any of the materials described in connection with the die attach film 400 in FIG. 4. In this example, the die attach film 1000 may not have any cuts to separate the die attach film 1000 into small pieces.

The film 1002 under the die attach film 1000 can be any suitable film. For example, the film 1002 can contain any of the materials of the films 102 described in connection with FIG. 1. Commercially available dicing film can be employed as the film 1002.

The die attach film 1000 can be placed on the film 1002 any suitable technique. Alternatively, any suitable commercially available die attach film placed on a film can be employed. For example, commercially available die attach films placed on a dicing film can be employed. Such a die attach film placed on a dicing film may be referred to as a dicing-die attach film. Examples of dicing-die attach films include those under the trade designations EM310X7, which is available from Nitto Denko Corporation.

Figure 11:
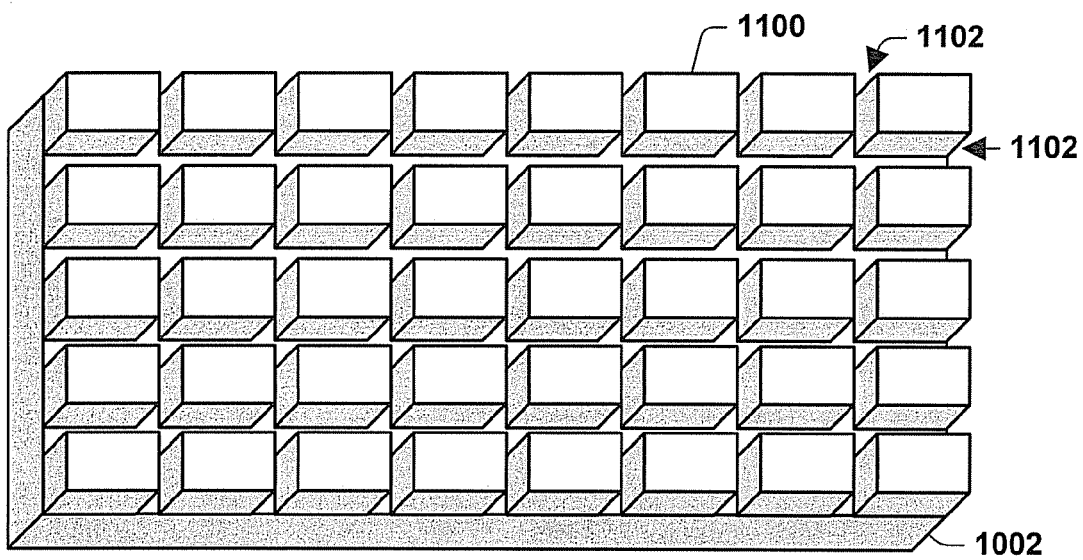
FIG. 11 illustrates a perspective view of a plurality of pieces of die attach film on a film after making intervals between the pieces of die attach film in accordance with an aspect of the subject invention.

FIG. 11 illustrates a perspective view of a plurality of pieces 1100 of die attach film 1000 on a film 1002 after making intervals 1102 between the pieces 1100 of die attach film 1000. Intervals 1102 between rows and columns of the pieces 1100 of die attach film 1000 are made by removing portions of the die attach film 1000. As a result, in one embodiment, the resultant pieces 1100 of die attach film 1000 have the substantially same size as the back side surfaces of singulated dice.

The portions are removed to a desired level that provides sufficient intervals 1102 between the pieces 1100 of die attach film 1000. The intervals 1102 between the rows and columns of pieces 1100 of die attach film 1000 may be set independently so as to facilitate their use in subsequent manufacturing processes (e.g., placing singulated dice on the pieces of die attach film). In one embodiment, all of the intervals 1102 between the rows and columns of the pieces 1100 of die attach film 1000 have the same lengths. In another embodiment, all of the intervals between the rows of the pieces of die attach film have the same lengths, all of the intervals between the columns of the pieces of die attach film have the same lengths, but the intervals between the rows are different from the intervals between the columns.

The lengths of intervals 1102 (e.g., a distance between the two pieces 1100 of die attach film 1000 that are next each other) may vary and are not critical to the subject invention. The portions of the die attach film 1000 are removed to provide desired intervals between the pieces 1100 of die attach film 1000 that depends on, for example, the desired implementations of the subject invention. In one embodiment, the lengths of intervals 1102 are about 0.1 millimeter or more and about 10 millimeters or less. In another embodiment, the lengths of intervals 1102 are about 0.5 millimeters or more and about 7 millimeters or less. In yet another embodiment, the lengths of intervals 1102 are about 1 millimeter or more and about 5 millimeters or less.

The portions of the die attach film 1000 can be removed by any suitable technique. For example, the portions of the die attach film 1000 are removed by a scriber, blade, laser, and the like. In one embodiment, the portions of the die attach film 1000 are removed by sawing about one time using a saw blade that has the substantially same blade width as the length of interval. In another embodiment, the portions of the die attach film 1000 are removed by sawing more than about one time using a saw blade that has a smaller width than the length of interval. For example, the portions of the die attach film are removed by sawing a few times using a thin saw blade.

Figure 12:
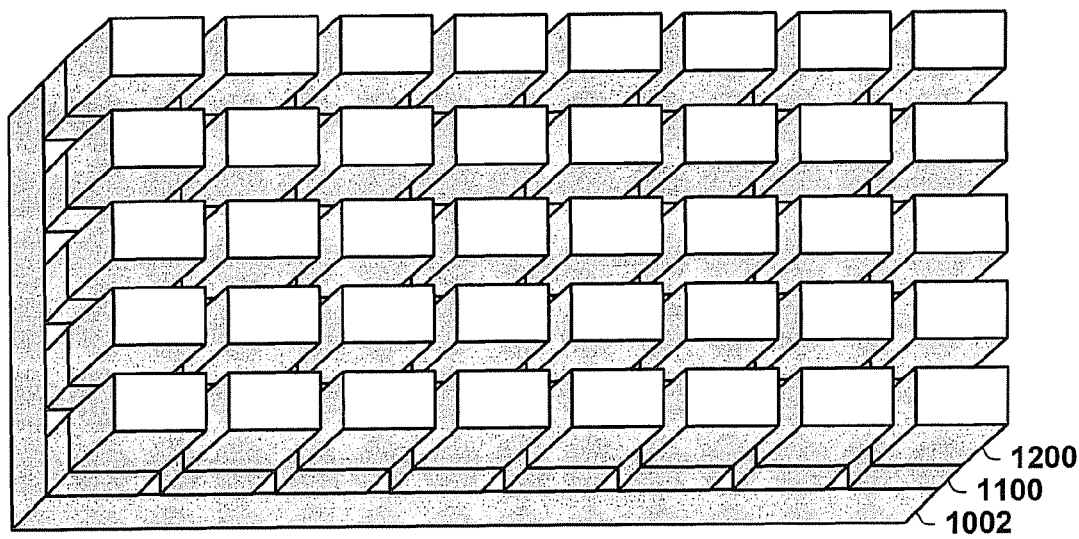
FIG. 12 illustrates a perspective view of a plurality of singulated dice attached back side down to a plurality of pieces of die attach film on a film in accordance with an aspect of the subject invention.

FIG. 12 illustrates a perspective view of a plurality of singulated dice 1200 attached back side down to a plurality of pieces 1100 of die attach film 1000 on a film 1002. A plurality of singulated dice 1200 are placed back side down on the pieces 1100 of die attach film 1000 by, for example, pick-and-place tools.

If necessary, pressure can be applied to the front side surfaces of the singulated dice 1200 to provide secure adhesion between the back side surfaces of the singulated dice 1200 and the pieces 1100 of die attach film 1000. The pressure can be applied to the singulated dice 1200 by any suitable technique. For example, the pressure is applied by a roller press. In one embodiment, a nonstick film is placed on the front side surfaces of the singulated dice 1200, and then a roller is pressed against the nonstick film.

Figure 13:
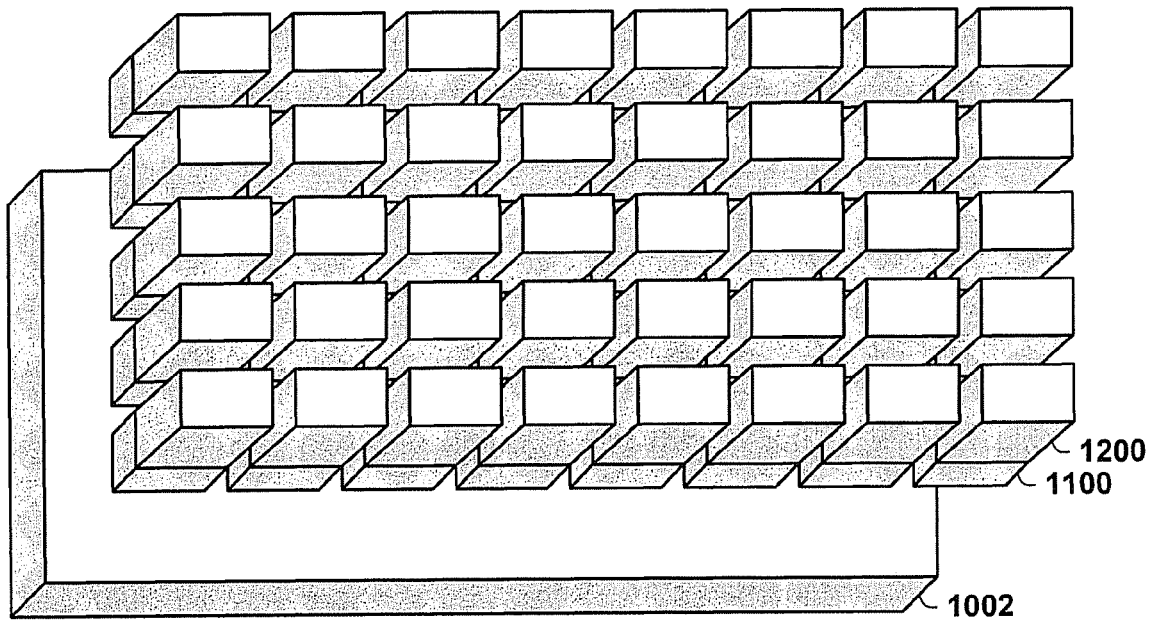
FIG. 13 illustrates a perspective view of a plurality of singulated dice on a plurality of pieces of die attach film detached from a film in accordance with an aspect of the subject invention.

FIG. 13 illustrates a perspective view of a plurality of singulated dice 1200 on a plurality of pieces 1100 of die attach film 1000 detached from a film 1002. The film 1002 under the pieces 1100 of die attach film 1000 can be removed from the plurality of pieces 1100 of die attach film 1000, and the plurality of singulated dice 1200 attached back side down to the pieces 1100 of die attach film 1000 is obtained. The film 1002 under the pieces 1100 of die attach film 1000 can be removed by any suitable technique. For example, the film 1002 is removed from the plurality of pieces 1100 of die attach film 1000 by reducing the adhesion between the film 1002 and the plurality of the pieces 1100 of die attach film 1000 via, for example, exposing the film 1002 to UV radiation and/or heating the film 1002 to elevated temperatures.

Although not shown, if necessary, the singulated die 1200 can be attached back side down to a substrate by the piece 1100 of die attach film. The singulated die 1200 can be attached on the substrate by any suitable technique. For example, the singulated die 1200 is attached back side down on the substrate in the same manner described in connection with the attachment of the singulated dice 100 in FIG. 9.

Figure 14:
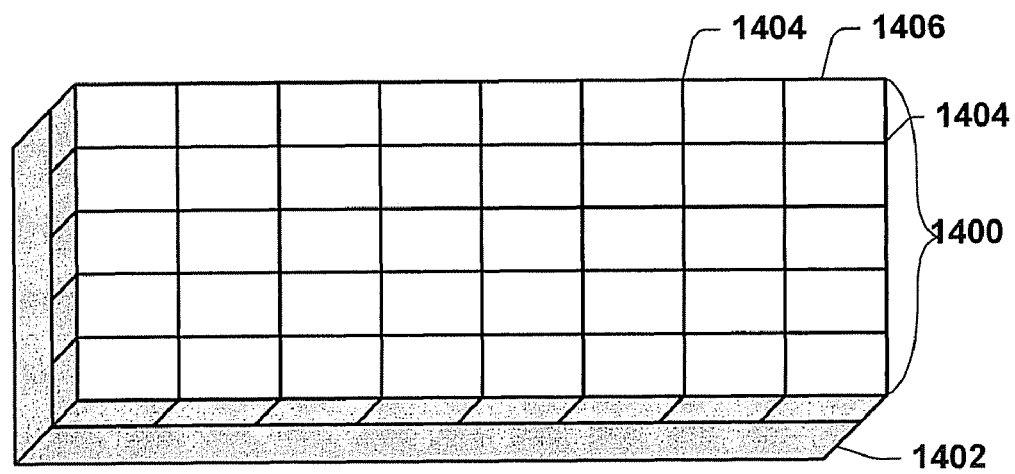
FIG. 14 illustrates a perspective view of a die attach film on a third expandable film in accordance with an aspect of the subject invention.

FIG. 14 illustrates a perspective view of a die attach film 1400 on a third expandable film 1402. The die attach film 1400 can be any suitable adhesive film that can attach back side surfaces of singulated dice to substrates. For example, the die attach film 1400 contains any of the materials described in connection with the die attach film 400 in FIG. 4. The third expandable film 1402 under the die attach film 1400 can be any suitable film that can be expanded under suitable conditions, for example, elevated temperatures. For example, the third expandable film 1402 can be any of the second expandable films 402 described in connection with FIG. 4.

A die attach film 1400 has cuts 1404 to separate the die attach film 1400 into small pieces 1406. In one embodiment, each piece 1406 of die attach film 1400 has the substantially same size as a back side surface of singulated die that is employed in subsequent processes. The die attach film 1400 can be cut by any suitable technique. For example, a die attach film 1400 having cuts 1404 can be obtained in the same manner described in connection with the die attach film 400 in FIG. 4.

Figure 15:
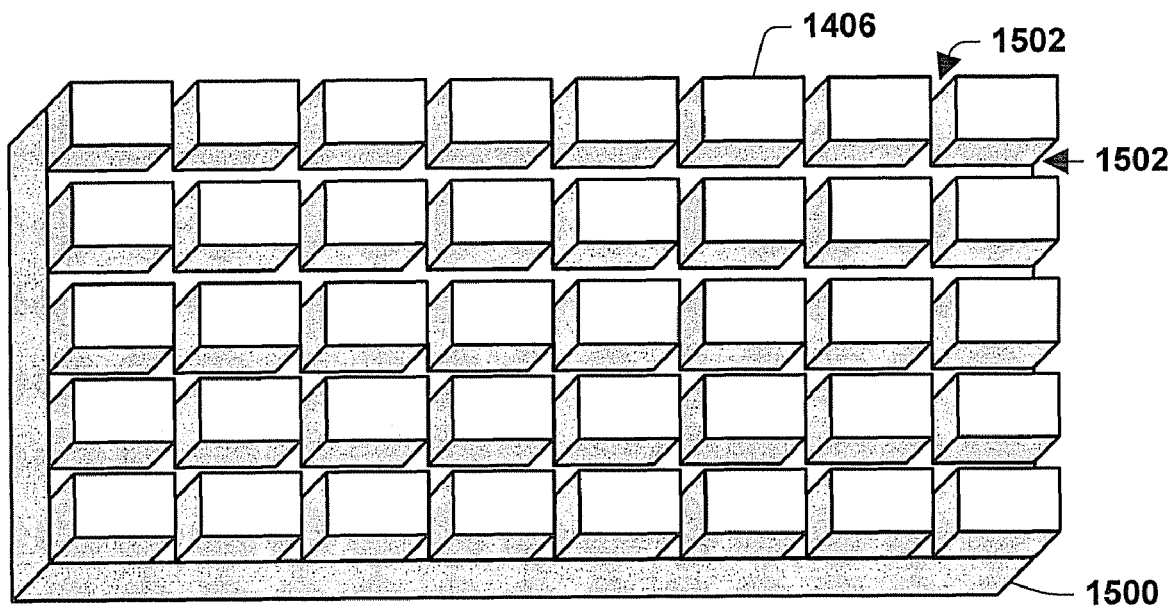
FIG. 15 illustrates a perspective view of a plurality of pieces of die attach film on a third expanded film after expanding the third expandable film in accordance with an aspect of the subject invention.

FIG. 15 illustrates a perspective view of a plurality of pieces 1406 of die attach film 1400 on a third expanded film 1500 after expanding the third expandable film 1402. The plurality of pieces 1406 of die attach film 1400 on the third expanded film 1500 have intervals 1502 between rows and columns of the pieces 1406 of die attach film 1400. The third expandable film 1402 can be expanded to any suitable level by any suitable technique. For example, the intervals 1502 between the rows and columns of pieces 1406 of die attach film 1400 are expanded to facilitate their use in subsequent manufacturing processes (e.g., placing singulated dice on the pieces 1406 of die attach film 1400. The third expandable film 1402 can be expanded in the same manner described in connection with the expansion of the first expandable film 200 in FIG. 3.

Figure 16:
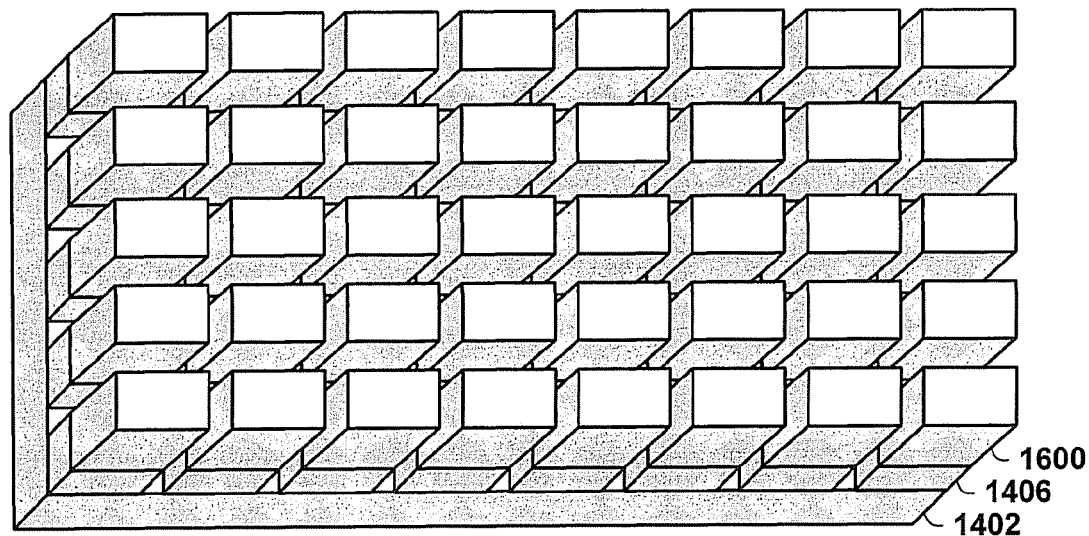
FIG. 16 illustrates a perspective view of a plurality of singulated dice attached back side down to a plurality of pieces of die attach film on a third expanded film in accordance with an aspect of the subject invention.

FIG. 16 illustrates a perspective view of a plurality of singulated dice 1600 attached back side down to a plurality of pieces 1406 of die attach film 1400 on a film 1402. A plurality of singulated dice 1600 are placed back side down on the pieces 1406 of die attach film 1400 by, for example, pick-and-place tools. If necessary, pressure can be applied to the front side surfaces of the singulated dice 1600 to provide secure adhesion between the pieces 1406 of die attach film 1400 and the back side surfaces of the singulated dice 1600. The pressure can be applied to the singulated dice 1200 by any suitable technique. For example, the pressure is applied by a roller press in the same manner described in connection with FIG. 12.

Figure 17:
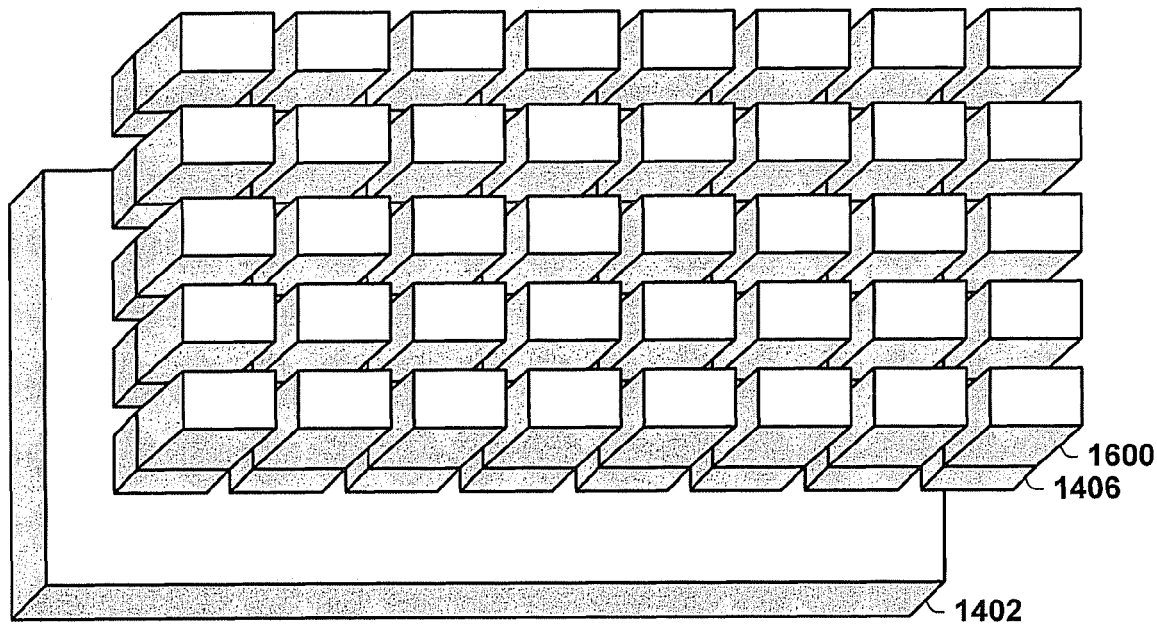
FIG. 17 illustrates a perspective view of a plurality of singulated dice on a plurality of pieces of die attach film detached from a third expanded film in accordance with an aspect of the subject invention.

FIG. 17 illustrates a perspective view of a plurality of singulated dice 1600 on a plurality of pieces 1406 of die attach film 1400 detached from a film 1402. The film 1402 under the pieces 1406 of die attach film 1400 is removed, and the plurality of singulated dice 1600 attached back side down to the pieces 1406 of die attach film 1400 is obtained. The film 1402 under the pieces 1406 of die attach film 1400 can be removed by any suitable technique. For example, the film 1402 is removed from the plurality of pieces 1406 of die attach film 1400 by reducing the adhesion between the film 1402 and the plurality of the pieces 1406 of die attach film 1400 via, for example, exposing the film 1402 to UV radiation and/or heating the film 1402 to elevated temperatures.

Although not shown, if necessary, the singulated die 1600 can be attached back side down to a substrate by the piece 1406 of die attach film 1400. The singulated die 1600 can be attached on the substrate by any suitable technique. For example, the singulated die 1600 is attached back side down on the substrate in the same manner described in connection with the attachment of the singulated dice 100 in FIG. 9.

Figure 18:
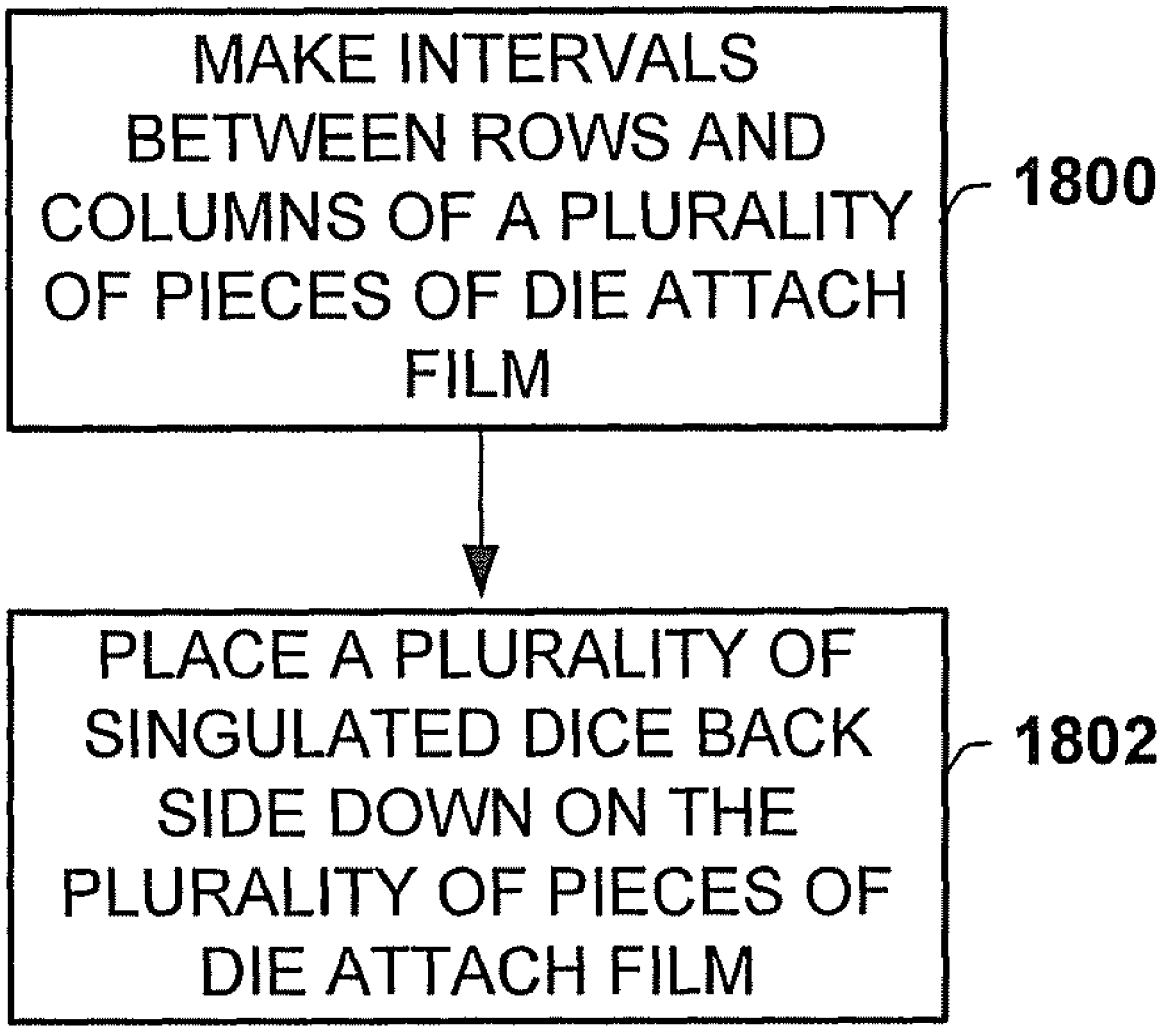
FIG. 18 illustrates an exemplary methodology of applying a plurality of pieces of die attach film to a plurality of singulated dice in accordance with an aspect of the subject invention.

FIG. 18 illustrates an exemplary methodology of applying a plurality of pieces of die attach film to a plurality of singulated dice. At 1800, intervals between rows and columns of a plurality of pieces of die attach film are made. In one embodiment, the intervals are made by expanding an underlaid expandable film on which the plurality of pieces of die attach film are placed. In another embodiment, the intervals are made by removing portions of the die attach film between rows and columns of the plurality of pieces of die attach film.

At 1802, a plurality of singulated dice is placed back side down on the plurality of pieces of die attach film. In one embodiment, each of the plurality of singulated dice is individually picked and placed back side down on the plurality of pieces of die attach film by, for example, a pick-and-place tool. In another embodiment, a plurality of singulated dice is remounted back side down on the plurality of pieces of die attach film by placing a film having the plurality of singulated dice on the plurality of pieces of die attach film. The plurality of singulated dice is mounted on the film at intervals that have the substantially same lengths as the intervals between the pieces of die attach film. Since the intervals between the plurality of singulated dice are substantially the same as the intervals between the plurality of pieces of die attach film, when placing the film having the plurality of singulated dice on the plurality of pieces of die attach film, each singulated die can be on top of each piece of the die attach film.

What has been described above includes examples of the subject invention. It is, of course, not possible to describe every conceivable combination of components or methodologies for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the term "contain," "includes," and "involves" are used in either the detailed description or the claims, such terms are intended to be inclusive in a manner similar to the term "comprising" as "comprising" is interpreted when employed as a transitional word in a claim.

What is claimed is:

1. A method of applying a plurality of pieces of die attach film to a plurality of singulated dice, comprising:
    making intervals between rows and columns of a plurality of pieces of die attach film by expanding an underlaid expandable film on which the plurality of pieces of die attach film are placed or by removing portions of the die attach film between rows and columns of the plurality of pieces of die attach film; and
    placing a plurality of singulated dice back side down on the plurality of pieces of die attach film.

2. The method of claim 1, wherein expanding the underlaid expandable film comprising heating the expandable film to elevated temperatures.

3. The method of claim 1, wherein removing portions of the die attach film comprises sawing the die attach film one or more times by a blade.

4. The method of claim 1, wherein all of the intervals between the rows and columns of the plurality of pieces of die attach film are substantially the same.

5. The method of claim 1, wherein placing a plurality of singulated dice back side down on the plurality of pieces of die attach film comprises picking and placing individually each of the plurality of singulated dice back side down on the plurality of pieces of die attach film.

6. The method of claim 1, wherein placing a plurality of singulated dice back side down on the plurality of pieces of die attach film comprises remounting the plurality of singulated dice back side down on the plurality of pieces of die attach film.

7. The method of claim 1 further comprising applying pressure on the plurality of dice after placing the plurality of singulated dice back side down on the plurality of pieces of die attach film.

8. The method of claim 1 further comprising removing the underlaid expandable film on which the plurality of pieces of die attach film are placed.

9. The method of claim 1 further comprising attaching the singulated die to a substrate by the piece of the die attach film.

10. The method of claim 6, wherein remounting the plurality of singulated dice back side down on the plurality of pieces of die attach film comprises placing a film having the plurality of singulated dice on the plurality of pieces of die attach film.

11. A method of applying a plurality of pieces of die attach film to a plurality of singulated dice, comprising:
    placing the plurality of singulated dice back side down on a film;
    remounting the plurality of singulated dice front side down on an first expandable film by placing the film having the plurality of singulated dice on the first expandable film;
    removing the film from the back side surfaces of the plurality of singulated dice;
    making intervals between rows and columns of the plurality of singulated dice by expanding the first expandable film;
    making intervals between rows and columns of a plurality of pieces of die attach film; and
    remounting the plurality of singulated dice back side down on the plurality of pieces of die attach film by placing the first expandable film having the plurality of singulated dice on the plurality of pieces of die attach film.

12. The method of claim 11, wherein making intervals between rows and columns of the plurality of pieces of die attach film comprises expanding an underlaid second expandable film on which the plurality of pieces of die attach film are placed or removing portions of the die attach film between the plurality of pieces of die attach film.

13. The method of claim 11 further comprising removing the first expandable film from the front side surfaces of the singulated dice.

14. The method of claim 11, wherein the intervals between the rows and columns of the plurality of singulated dice are the substantially same as the intervals between the rows and columns of the plurality of pieces of die attach film.

15. The method of claim 11 further comprising attaching the singulated die to a substrate by the piece of the die attach film.

16. The method of claim 12 further comprising removing the underlaid second expandable film on which the plurality of pieces of die attach film are placed.

* * * * *